United States Patent [19]

Oguro et al.

[11] Patent Number: 5,443,661
[45] Date of Patent: Aug. 22, 1995

[54] SOI (SILICON ON INSULATOR) SUBSTRATE WITH ENHANCED GETTERING EFFECTS

[75] Inventors: Shizuo Oguro; Tatsuya Suzuki, both of Tokyo, Japan

[73] Assignee: NEC Corporation, Tokyo, Japan

[21] Appl. No.: 280,994

[22] Filed: Jul. 27, 1994

[30] Foreign Application Priority Data

Jul. 27, 1993 [JP] Japan .................................. 5-184561

[51] Int. Cl.⁶ ............................................ H01L 21/20
[52] U.S. Cl. ..................... 148/33.5; 437/61; 437/62; 437/10; 437/12; 148/33.3; 148/DIG. 12
[58] Field of Search .............. 437/61, 62, 974, 10, 437/12; 148/DIG. 135, DIG. 12, 33.3, 33.5

[56] References Cited

U.S. PATENT DOCUMENTS

| | | | |
|---|---|---|---|
| 5,194,395 | 3/1993 | Wada | 437/10 |
| 5,229,305 | 7/1993 | Baker | 437/974 |
| 5,312,782 | 5/1994 | Miyazawa | 437/62 |
| 5,327,007 | 7/1994 | Imura et al. | 437/10 |

FOREIGN PATENT DOCUMENTS

| | | | |
|---|---|---|---|
| 0154121 | 7/1986 | Japan | 437/12 |
| 63-271941 | 11/1988 | Japan | . |
| 2-237121 | 3/1989 | Japan | . |
| 0237032 | 9/1990 | Japan | 437/12 |
| 0237120 | 9/1990 | Japan | 437/12 |
| 0076249 | 4/1991 | Japan | 437/62 |
| 3-132055 | 6/1991 | Japan | . |
| 0123456 | 4/1992 | Japan | 437/61 |

Primary Examiner—Brian E. Hearn
Assistant Examiner—Trung Dang
Attorney, Agent, or Firm—Burns, Doane, Swecker & Mathis

[57] ABSTRACT

A silicon-on-insulator (SOI) substrate is arranged such that a polycrystalline silicon film which functions as a gettering site for heavy metals is provided on a first single crystal silicon substrate, a silicon oxide island film is partially provided in a polycrystalline silicon film, and a second single crystal silicon substrate is provided on an entire upper surface of the polycrystalline silicon film. An element isolation trench extends from an upper surface of the second single crystal silicon substrate to an upper surface of the first single crystal silicon substrate, and a silicon oxide film is buried in the element isolation trench. The SOI substrate thus constituted has a high gettering effect for heavy metals.

11 Claims, 3 Drawing Sheets

SOI (SILICON ON INSULATOR) SUBSTRATE WITH ENHANCED GETTERING EFFECTS

BACKGROUND OF THE INVENTION (1) Field of the Invention

The present invention relates to an SOI (silicon on insulator) substrate, and more particularly to an SOI substrate having enhanced gettering effects.

(2) Description of the Related Art

In a highly integrated semiconductor device, the device characteristics are markedly deteriorated by impurities or faults inherent in materials and also by faults induced or introduced during the fabrication process, and especially by contamination caused by heavy metal impurities. Therefore, it is necessary for the device to have gettering effects in order to eliminate heavy metals or faults from an element area of the device.

A first example of a conventional SOI substrate having a gettering effect with respect to heavy metals or faults has been disclosed in Japanese Patent Application Kokai Publication No. Hei 2-237121. In this example, as shown in FIG. 1, a buried silicon oxide film 22 is partially formed in an upper surface of a single crystal silicon substrate 21 by a selective oxidation process and, after being flattened or planarized, this is bonded onto the overlying single crystal silicon substrate 23. This structure can achieve intrinsic gettering effects in an IG (intrinsic getter) fault layer 21A of the underlying single crystal silicon substrate 21.

A second conventional example has been disclosed in Japanese Patent Application Kokai Publication No. Hei 3-132055. In this example, as shown in FIG. 2, a silicon oxide film 22A is formed on a first single crystal silicon substrate 21, on which a buffer layer 24 such as an amorphous silicon film or polycrystalline silicon (also called polysilicon) film having gettering capabilities and film strain relaxing capabilities is provided, and then a second single crystalline silicon substrate 23A is formed thereon.

A third conventional example which, although not of an SOI substrate, includes a gettering means also used in element isolation, has been disclosed in Japanese Patent Application Kokai Publication No. Sho 63-271941. In this example, as shown in FIG. 3, an N-type epitaxial layer 26 is formed on a single crystal silicon substrate 21 having therein an N-type buried diffusion layer 25, an element isolation region is patterned to form a trench which is filled with a polycrystalline silicon film 24A followed by a boron diffusion therein. The polycrystalline silicon film 24A is used as an isolation element and at the same time as a gettering site for heavy metal contamination.

In the first and the third example shown in FIG. 1 and FIG. 3, respectively, since the isolation is incomplete with respect to the underlying single crystal silicon substrate 21, it is not possible to sufficiently reduce soft-errors caused by carriers originating as a result of α radiation. Moreover, in the third example, since boron (B) of the polycrystalline silicon film 24A diffuses to the device formation region during the device fabrication and in thermal treatment during subsequent device formation, the possibility of realizing higher device density is prevented.

In the second example, since the polycrystalline silicon film 24, which becomes the gettering site, is provided on the entire surface of the silicon oxide film 22A, warping of a substrate occurs thereby causing strain and faults in the substrate. The polycrystalline silicon film 24 is weak in its gettering capability with respect to iron (Fe) and, moreover, the gettering site thereof is located close to the device formation region. A disadvantage therefore is that the substrate is likely to be affected by the re-diffusion of heavy metals, having previously once undergone gettering, into the device formation region.

SUMMARY OF THE INVENTION

An object of the present invention, therefore, is to overcome the problems existing in the prior art and to provide an improved SOI substrate having gettering effects.

Another object of the invention is to provide an SOI substrate in which it is possible to reduce surface fault density thereby reducing reverse bias leakage currents of a diode.

According to one aspect of the invention, there is provided a silicon-on-insulator (SOI) substrate comprising:
   a first single crystal silicon substrate;
   a polycrystalline silicon film provided on an entire upper surface of the first single crystal silicon substrate;
   a silicon oxide island film partially provided in the polycrystalline silicon film; and
   a second single crystal silicon substrate provided on an entire upper surface of the polycrystalline silicon film.

According to another aspect of the invention, there is also provided a silicon-on-insulator (SOI) substrate comprising:
   a first single crystal silicon substrate;
   a silicon oxide film provided on an entire upper surface of the first single crystal silicon substrate;
   a second single crystal silicon substrate provided on an entire upper surface of the silicon oxide film;
   an element isolation trench extending from an upper surface of the second single crystal silicon substrate to an upper portion of the first single crystal silicon substrate; and
   a polycrystalline silicon film buried in the element isolation trench.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments are explained with reference to the accompanying drawings.

Figure 4:
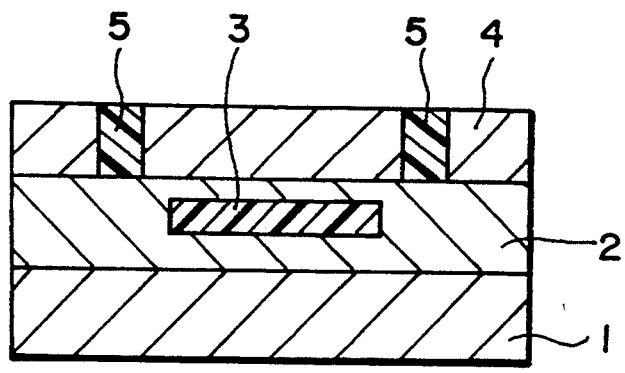
FIG. 4 is a diagrammatic sectional view of a structure of a first embodiment according to the invention.

As shown in FIG. 4, on a P+-type single crystal silicon substrate 1, which is a first single crystal silicon substrate, there is formed a polycrystalline silicon film 2 which has internally been provided with a silicon oxide island film 3. On the entire surface of the polycrystalline silicon film 2, there is formed a P-type single crystalline silicon substrate 4, formed by the CZ (Czochralski) method. Also, in an element isolation region of the single crystal silicon substrate 4, there is formed a trench which reaches the polycrystalline silicon film 2 and which is filled with a silicon oxide film 5.

Figure 5A:
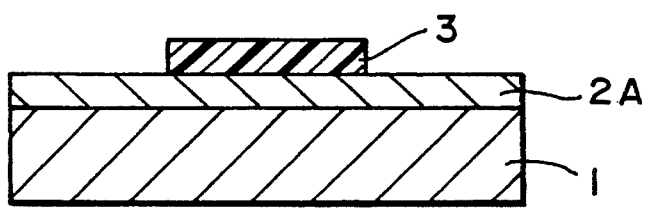
FIGS. 5A, 5B and 5C are diagrammatic sectional views of a semiconductor chip for explaining the fabrication steps of the structure of the first embodiment shown in FIG. 4.

Now, the fabrication steps for the above is explained with reference to FIGS. 5A, 5B and 5C. As shown in 5A, a polycrystalline film 2A having a thickness of 9 $\mu$m is formed by a low-pressure chemical vapor deposition (LPCVD) process on a P+-type single crystal silicon substrate 1 (orientation of $<100>$, impurity concentration of $1\sim5\times10^{19}$ cm$^{-3}$ and resistance of $10\sim20$ m$\Omega$·cm) and, on the entire surface thereof, there is formed a silicon oxide film 3 of 500 nm thick. Next, this silicon oxide film 3 is patterned by photolithography and etching processes thereby forming a silicon oxide island film 3 as shown in FIG. 5A.

Figure 5B:
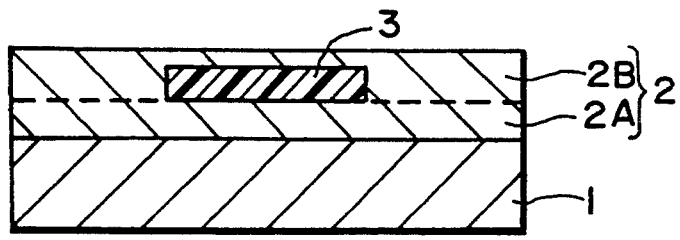
Figure 5C:
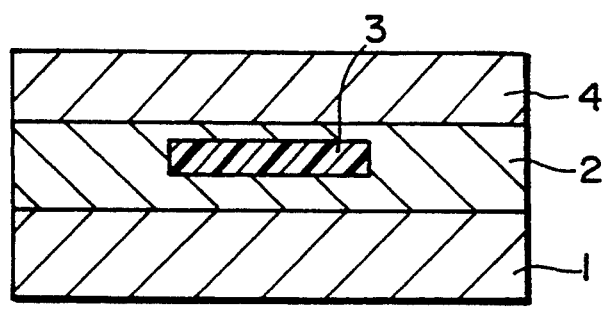

Next, as shown in FIG. 5B, the LPCVD process is used again to form a polycrystalline silicon film 2B on the order of 2 $\mu$m, the surface of which is then flattened by polishing. Then, as shown in FIG. 5C, on the flattened surface of the polycrystalline silicon film 2 is bonded the P-type single crystal silicon substrate 4 (orientation of $<100>$ and resistance of $10\sim20$ $\Omega$·cm) by a thermal process for about 2 hours at the temperature of 1000° C. Next, as shown in FIG. 4, firstly the single crystalline silicon substrate 4 at the side of the device formation region is ground and polished to a predetermined thickness (for example, $0.1\sim10$ $\mu$m), and then a trench for element isolation is formed by the photolithography and etching technique. This trench is then filled with the silicon oxide film 5 thereby forming the element isolation region.

The SOI substrate fabricated as above has been subjected to a heavy metal quantitative contamination test together with the conventional SOI substrate. The contamination element used is iron (Fe) and the method employed for contaminating is a method wherein the surface of the SOI substrate is spin-coated in a solution prepared by diluting an optical atomic absorption analysis standard solution in Fe-ion-concentration of 100 ppm. The above SOI substrate has been subjected to three stage heat treatments consisting of a treatment at 1150° C. for 2 hours (N$_2$ atmosphere), a treatment at 850° C. for 3 hours (N$_2$ atmosphere), and a treatment at 1000° C. for 16 hours (dry-O$_2$ atmosphere) and, after being surface-treated by the Secco-etching solution, the fault density of the surface has been measured.

The test result is that, with respect to the SOI substrate of the first embodiment, the surface fault density is about $1.5\times10^2$ cm$^{-2}$, which is a reduction down to 60% as compared with that of the SOI substrate of the first and third conventional examples ($2.6\times10^2$ cm$^{-2}$). Also, the reduction is greater than one order of magnitude with respect to the second conventional example ($3.1\sim6.5\times10^3$ cm$^{-2}$). The reduction is achieved because, underneath the device formation region, there extends over a large region a polycrystalline silicon film 2 which is a gettering site for heavy metals and, especially for iron (Fe), the silicon oxide film 5 is buried not entirely but partially, so that the gettering with respect to the underlying P+-type single crystal silicon substrate 1 is enhanced. The carriers resulting from $\alpha$ radiation after the device fabrication decouple easily within the P+-type single crystal silicon substrate and the polycrystalline silicon film which has a short free path so that the frequencies in which soft-errors occur due to carriers can also be suppressed to the same extent as in the second conventional example, that is, the reduction to about 20% compared with the first and third conventional examples. In the above embodiment of the invention, a P+-type substrate was used as the underlying single crystal silicon substrate but the gettering effect to the same extent was obtained when use was made of the P-type single crystal silicon substrate having an impurity concentration of $10^{15}\sim10^{16}$ cm$^{-3}$.

Figure 6:
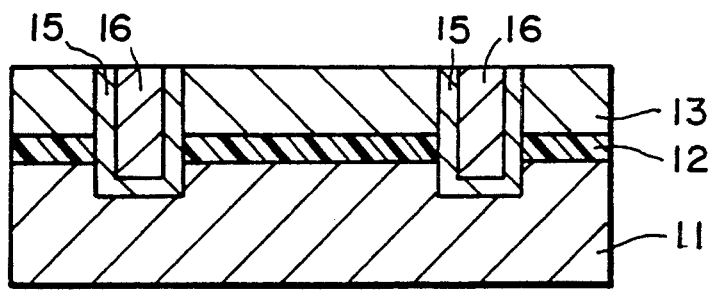
FIG. 6 is a diagrammatic sectional view of a structure of a second embodiment according to the invention.

FIG. 6 shows in a sectional view of a second embodiment of the SOI substrate according to the invention. In this SOI substrate, a silicon oxide film 12 is formed on the entire surface of a P+-type single crystal silicon substrate 11 which is a first single crystal silicon substrate. An N-type single crystal silicon substrate 13 is formed on the silicon oxide film 12. A trench for element isolation is formed such that it extends from the N-type single crystal silicon substrate 13 into an upper portion of the P+-type single crystal silicon substrate 11. The trench is filled with a non-doped polycrystalline silicon film 15 and a doped polycrystalline silicon film 16.

Figure 7A:
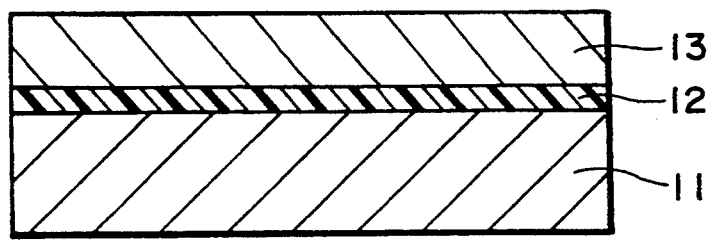
FIGS. 7A and 7B are diagrammatic sectional views of a semiconductor chip for explaining the fabrication steps of the structure of the second embodiment shown in FIG. 6.

Now, a fabrication method for the above is explained with reference to FIGS. 7A and 7B. As shown in FIG. 7A, the silicon oxide film 12 is formed on the P+-type single crystal silicon substrate 11 (orientation of $<100>$ and resistance of $10\sim20$ m$\Omega$·cm), to which the N-type single crystalline silicon substrate 13 (orientation of $<100>$ and resistance of $10\sim20$ $\Omega$·cm) formed by the CZ method is thermally bonded, and then the substrate 13 at the device formation region side is ground and polished to a predetermined thickness (for example, $0.1\sim10$ $\mu$m).

Figure 7B:
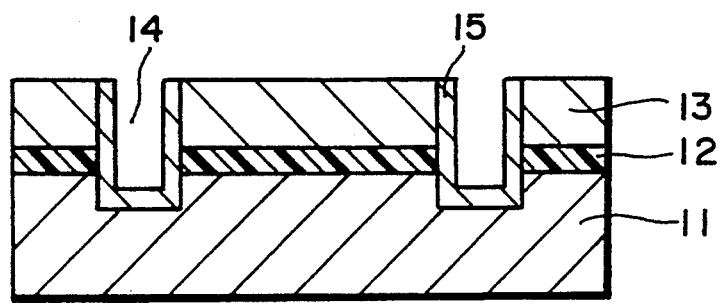

Next, as shown in FIG. 7B, a trench 14 for element isolation is formed so as to penetrate N-type single crystalline silicon substrate 13 and further to reach an upper portion of the underlying single crystal silicon substrate 11, the non-doped polycrystalline silicon film 15 is formed on side and bottom surfaces of the trench 14 to a thickness of 100 nm by the LPCVD method, and then the P+-type doped polycrystalline silicon film 16, in which boron (B) is doped in a high concentration ($7\times10^{19}$ cm$^{-3}$ or more), is formed such that the trench 14 is filled completely with non-doped and doped polycrystalline silicon films 15 and 16 as shown in FIG. 6.

In the SOI substrate fabricated as above, the polycrystalline silicon films 15 and 16 which constitute a gettering site do not terminate at a location above the silicon oxide film 12 but reach the underlying substrate 11. This enables the diffusion of heavy metals to the underlying semiconductor substrate 11 and functions so as to expand the gettering region. Moreover, the gettering region being fixed to the same potential as that of the underlying semiconductor substrate commonly serves as a sufficient element isolation function region. Also, since the polycrystalline silicon film is formed in two stages consisting of a non-doped stage and a doped stage, the diffusion of dopants to the device through various thermal treatments carried out during the device fabrication is suppressed to a minimum, which is advantageous in the improvement of device density.

Figure 1:
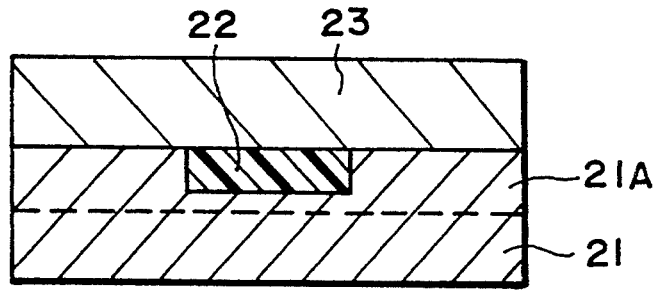
FIG. 1 is a diagrammatic sectional view of an example of a structure of the prior art.
Figure 2:
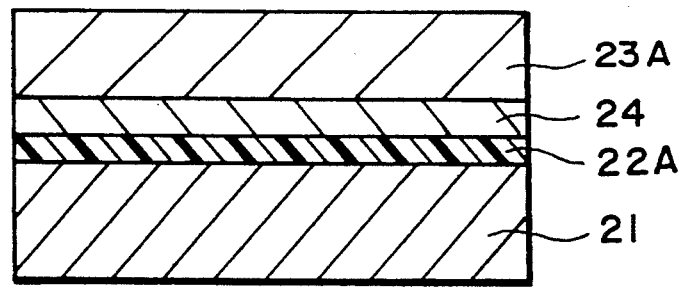
FIG. 2 is a diagrammatic sectional view of another example of a structure of the prior art.
Figure 3:
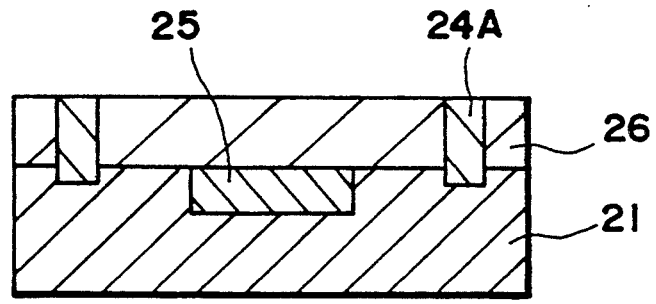
FIG. 3 is a diagrammatic sectional view of still another example of a structure of the prior art.

With respect to the second embodiment, too, the same quantitative contamination test of iron (Fe) as with the first embodiment was conducted, which showed that the faulty density of the surface was $1.5 \times 10^2$ cm$^{-2}$ which is a reduction to about 60% of the value in the prior art and that the frequencies of soft-errors caused by $\alpha$ radiation were reduced to the same extent as with the second prior art shown in FIG. 2.

From the above, it can be appreciated that the SOI substrate of the second embodiment of the invention is one which cannot be realized by the prior art method and which offers the excellent gettering effect and prevents adverse effects of $\alpha$ radiation.

In the above explained embodiment of the invention, the N-type single crystal silicon substrate has been used on the silicon oxide film but it is possible to use a P-type single crystal silicon substrate formed by the CZ method for the device formation region. In such a case, by using the underlying single crystal silicon substrate as an N+-type and using the N+-type doped polycrystalline silicon, it is possible to achieve the same or similar effects as described above.

Next, the results of the measurement of reverse bias leakage currents in the case where a P+N diode is formed using the SOI substrate of the second embodiment of the invention are explained.

Figure 8:
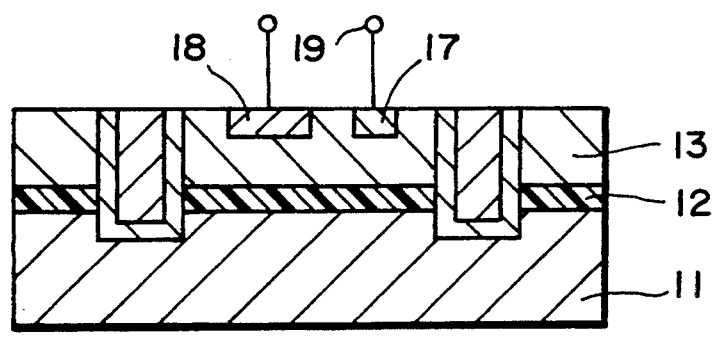
FIG. 8 is a diagrammatic sectional view of the structure of the second embodiment according to the invention, for explaining the effects produced thereby.

As shown in FIG. 8, the SOI substrate is formed in the same way as in the second embodiment and a P+-type diffusion layer 18 and an N+-type diffusion layer 17 are formed in the device formation region by an ion implantation process (conditions being BF$_2$+, 30 KeV, $2 \times 10^{15}$ cm$^{-2}$ for the P+-type diffusion layer 18; and As+, 30 KeV, $3 \times 10^{15}$ cm$^{-2}$ for the N+-type diffusion layer 17) and a thermal treatment in N$_2$ atmosphere at 900° C. for 10 minutes. The results of evaluation of the leakage currents during the operation under the reverse bias state of 5 V were that the reverse bias leakage currents at 100° C. of the P+N diode was $5 \times 10^{-8}$ Acm$^{-2}$ and there was a reduction of about one order of magnitude as compared with $3 \times 10^{-7}$ Acm$^{-2}$ in the diode fabricated according to the prior art method.

It has also been confirmed that, where the SOI substrate of the first embodiment is used, the performance of reverse bias leakage currents has been improved similarly as in the second embodiment of the invention.

As explained hereinabove, according to the first aspect of the invention, since the gettering site for heavy metals constituted by a polycrystalline silicon film is formed extending over a large area under the device formation region, it is possible to reduce surface fault density thereby reducing the reverse bias leakage currents of the diode. Moreover, because the carriers in the P+-type single crystal silicon substrate and the polycrystalline silicon layer have a short free path, it is possible to reduce the frequencies at which soft-errors occur caused by $\alpha$ radiation after the device fabrication.

Also, according to the second aspect of the invention in which a trench for element isolation is provided, the trench is filled with a non-doped polycrystalline silicon film and a doped polycrystalline silicon film, and furthermore this trench penetrates through to the underlying first single crystalline silicon substrate. In view of this configuration, the advantages resulting therefrom include the following:

First, since heavy metals undergo sufficient gettering to the polycrystalline silicon film or to the underlying single crystal silicon substrate through the polycrystalline silicon film, it is possible to reduce surface fault density and reverse bias leakage currents of the diode. Moreover, since the silicon oxide film is provided entirely under the device formation region, it is possible to reduce the frequencies at which soft-errors occur caused by $\alpha$ radiation. Also, the polycrystalline silicon film of the element isolation region is divided into a non-doped layer and a doped layer, the diffusion of impurities to the device formation region is suppressed to a minimum, which facilitates and enhances the realization of higher device density.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A silicon-on-insulator (SOI) substrate comprising:
   a first single crystal silicon substrate;
   a polycrystalline silicon film provided on an entire upper surface of said first single crystal silicon substrate;
   a silicon oxide island film provided in said polycrystalline silicon film with all surfaces including an upper surface of said silicon oxide island film being covered by said silicon polycrystalline silicon film; and
   a second single crystal silicon substrate provided on an entire upper surface of said polycrystalline silicon film.

2. A silicon-on-insulator (SOI) substrate comprising:
   a first single crystal silicon substrate;
   a polycrystalline silicon film provided on an entire upper surface of said first single crystal silicon substrate;
   a silicon oxide island film provided in said polycrystalline silicon film;
   a second single crystal silicon substrate provided on an entire upper surface of said polycrystalline silicon film; and
   an element isolation trench provided in said second single crystal silicon substrate and filled with a silicon oxide film, said element isolation trench extending from an upper surface of said second single crystal silicon substrate to the upper surface of said polycrystalline silicon film.

3. The SOI substrate according to claim 1, in which said first and second single crystal silicon substrates are of a P-type conductivity.

4. A silicon-on-insulator (SOI) substrate comprising:
   a first single crystal silicon substrate;
   a silicon oxide film provided on an entire upper surface of said first single crystal silicon substrate;
   a second single crystal silicon substrate provided on an entire upper surface of said silicon oxide film;
   an element isolation trench extending from an upper surface of said second single crystal silicon substrate to an upper portion of said first single crystal silicon substrate; and a polycrystalline silicon film buried in said element isolation trench and being in direct contact with said first single crystal silicon substrate and said second single crystal silicon substrate.

5. The SOI substrate according to claim 4, in which said polycrystalline silicon film includes an inner polycrystalline silicon film layer and an outer polycrystalline silicon film layer surrounding said inner polycrystalline silicon film layer and provided on side and bottom surfaces of said element isolation trench.

6. A silicon-on-insulator (SOI) substrate comprising:
a first single crystal silicon substrate;
a silicon oxide film provided on an entire upper surface of said first single crystal silicon substrate;
a second single crystal silicon substrate provided on an entire upper surface of said silicon oxide film;
an element isolation trench extending from an upper surface of said second single crystal silicon substrate to an upper portion of said first single crystal silicon substrate; and
a polycrystalline silicon film buried in said element isolation trench, wherein said polycrystalline silicon film includes an inner polycrystalline silicon film layer and an outer polycrystalline silicon film layer surrounding said inner polycrystalline silicon film layer and provided on side and bottom surfaces of said element isolation trench, and wherein said inner polycrystalline silicon film layer is a doped polycrystalline silicon film layer and said outer polycrystalline silicon film layer is a non-doped polycrystalline silicon film layer.

7. The SOI substrate according to claim 6, in which said doped polycrystalline silicon film layer is doped with boron (B).

8. A silicon-on-insulator (SOI) substrate comprising:
a first single crystal silicon substrate;
a silicon oxide film provided on an entire upper surface of said first single crystal silicon substrate;
a second single crystal silicon substrate provided on an entire upper surface of said silicon oxide film;
an element isolation trench extending from an upper surface of said second single crystal silicon substrate to an upper portion of said first single crystal silicon substrate; and
a polycrystalline silicon film buried in said element isolation trench,
wherein said first single crystal silicon substrate is of a P-type conductivity and said second single crystal silicon substrate is of an N-type conductivity.

9. The SOI substrate according to claim 1, further comprising an element isolation trench provided in said second single crystal silicon substrate and filled with a silicon oxide film, said element isolation trench extending from an upper surface of said second single crystal silicon substrate to the upper surface of said polycrystalline silicon film.

10. The SOI substrate according to claim 5, in which said inner polycrystalline silicon film layer is a doped polycrystalline silicon film layer and said outer polycrystalline silicon film layer is a non-doped polycrystalline silicon film layer.

11. The SOI substrate according to claim 4, in which said first single crystal silicon substrate is of a P-type conductivity and said second single crystal silicon substrate is of an N-type conductivity.

* * * * *